(12) United States Patent
Yao

(10) Patent No.: US 7,619,475 B2
(45) Date of Patent: Nov. 17, 2009

(54) CANCELLATION OF COMMON MODE OSCILLATION IN RF CIRCUITS

(75) Inventor: Weijun Yao, Mountain View, CA (US)

(73) Assignee: Ralink Technology (Singapore) Corporation, Singapore (SG)

( * ) Notice: Subject to any disclaimer, the term of this patent is extended or adjusted under 35 U.S.C. 154(b) by 63 days.

(21) Appl. No.: 12/042,044

(22) Filed: Mar. 4, 2008

(65) Prior Publication Data

US 2009/0224831 A1 Sep. 10, 2009

(51) Int. Cl.
*H03F 3/45* (2006.01)
(52) U.S. Cl. .................. 330/258; 330/253; 330/259
(58) Field of Classification Search ......... 330/252–253, 330/258–259; 326/21, 27
See application file for complete search history.

(56) References Cited

U.S. PATENT DOCUMENTS

| | | | | |
|---|---|---|---|---|
| 5,847,600 A | * | 12/1998 | Brooks et al. | 330/9 |
| 6,577,185 B1 | * | 6/2003 | Chandler et al. | 330/9 |
| 6,661,288 B2 | * | 12/2003 | Morgan et al. | 330/258 |
| 6,788,142 B2 | * | 9/2004 | Li et al. | 330/253 |
| 6,867,649 B2 | * | 3/2005 | Lehto | 330/252 |
| 2006/0082415 A1 | * | 4/2006 | Gopinathan et al. | 330/253 |
| 2008/0218267 A1 | * | 9/2008 | Taylor et al. | 330/259 |
| 2009/0058525 A1 | * | 3/2009 | Damitio et al. | 330/257 |

* cited by examiner

*Primary Examiner*—Vibol Tan
*Assistant Examiner*—Jason Crawford
(74) *Attorney, Agent, or Firm*—Sawyer Law Group P.C.

(57) ABSTRACT

A multistage RF amplifier amplifies RF signals used for communication in a WLAN communications system. The multistage RF amplifier comprises a first amplifier circuit coupled to a second amplifier circuit to maximize amplification. A common mode of the first amplifier circuit is coupled to a common mode of the second amplifier circuit to provide a voltage offset. The voltage offset counters voltage changes due to oscillations in the first amplifier circuit, thereby reducing interference from the multistage RF amplifier.

18 Claims, 3 Drawing Sheets

CANCELLATION OF COMMON MODE OSCILLATION IN RF CIRCUITS

FIELD OF THE INVENTION

The present invention relates generally to common-mode oscillation and more specifically to a cancellation mode for common-mode oscillation in RF circuits.

BACKGROUND OF THE INVENTION

Typically, a radio frequency (RF) amplifier accepts a varying input signal and produces a varying output signal, but with a larger amplitude. In one example, the output signal can be an RF signal that is fed to an antennae for broadcast to a remote receiver. The RF amplifier can use solid state devices such as field effect transistors (FETs) for boosting input signals of low power applications.

One RF amplifier design employs a single FET to provide a stable output signal that is free from oscillation. However, the single FET may not provide enough power. Another amplifier design employs a parallel set of two or more FETs to increase the power rating, or provide the same power with less effort than the single FET. However, the parallel FETs are susceptible to undesirable oscillations that are sometimes called "parallel FET oscillation" or "odd mode oscillation." The oscillation can be caused by inductance from downbond or bondwires. Moreover, in a cascaded power amplifier design, which includes multiple stages of amplification, the oscillation is amplified as well.

The oscillation of RF amplifiers is problematic when used along side sensitive components. For example, many system on a chip (SoC) configurations, such as those used for wireless local access networks (WLANs), include digital components. Oscillations from the RF amplifier reduces stability during operations.

Current approaches to reducing oscillation can attenuate the signal. For example, the gain of an amplifier can be reduced to reduce the oscillation fed to a subsequent amplifier stage. In another example, a matching resistive network can be provided to attenuate the gate currents. Problematically, both examples reduce the total output of the RF amplifier.

Accordingly, what is desired is an RF amplifier that cancels out oscillation between amplification stages without reducing the output power. The present invention addresses such a need.

SUMMARY OF THE INVENTION

The present invention meets these needs by providing a method and system for minimizing (or substantially cancelling) oscillation between amplification stages. In one embodiment, a multistage RF amplifier amplifies RF signals used for communication in a WLAN communications system. The multistage RF amplifier comprises a first amplifier circuit coupled to a second amplifier circuit to maximize amplification. Each of the first the second stage amplifier further comprise transistors (e.g., FETs) and supporting components (e.g., inductors). In one embodiment, FETs are configured in parallel to maximize power output.

A common mode of the first amplifier circuit is coupled to a common mode of the second amplifier circuit to provide a voltage offset. The voltage offset counters voltage changes due to oscillations in the first amplifier circuit, thereby reducing interference from the multistage RF amplifier.

Advantageously, amplifier stages can be cascaded together at a maximum power output when used in a system on a chip (SoC). Interference from the analog amplification to sensitive components of the SoC, such as digital components, is minimized.

BRIEF DESCRIPTION OF DRAWINGS

The accompanying drawings illustrate several embodiments of the invention and, together with the description, serve to explain the principles of the invention. One skilled in the art will recognize that the particular embodiments illustrated in the drawings are merely exemplary, and are not intended to limit the scope of the present invention.

DETAILED DESCRIPTION OF PREFERRED EMBODIMENTS

The present invention relates generally to common-mode oscillation and more specifically to a cancellation of common-mode oscillation in RF circuits. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
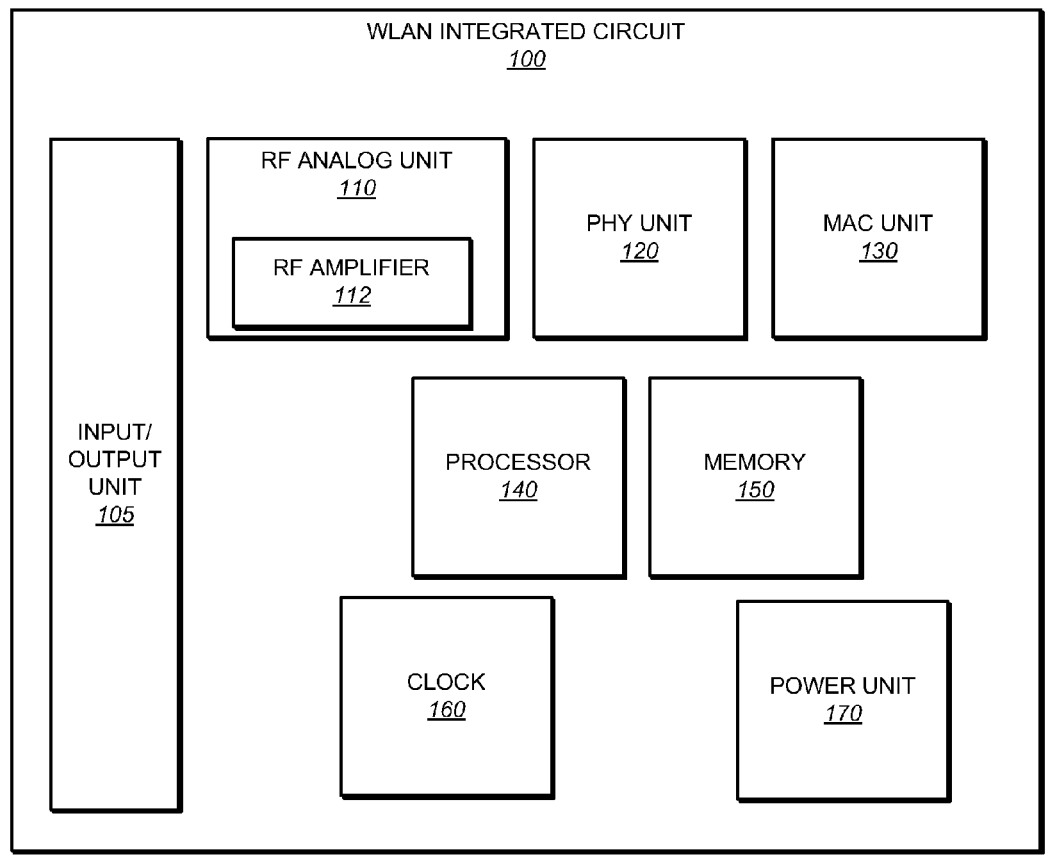
FIG. 1 is a block diagram illustrating a wireless local access network (WLAN) integrated circuit including an RF amplifier to cancel oscillation, according to one embodiment of the present invention.

FIG. 1 is a block diagram illustrating a WLAN integrated circuit (IC) 100, according to one embodiment of the present invention. The IC 100 can comprise an input/output unit 105, an RF analog unit 110 including an RF amplifier 112, a PHY unit 120, a MAC unit 130, a processor 140, a memory 150, a clock 160 and a power unit 170.

In one embodiment, the IC 100 can be a system on a chip (SoC) combining many components on a single silicon substrate. The combination of analog and digital devices requires an implementation that minimizes interference between the devices. The IC 100 can be implemented in network devices such as 3G and broadband handsets. The IC 100 can be compliant with standards such as IEEE 802.11 versions a, b, g or n. Exemplary operation modes include frequencies of 2.4 GHz and 5.0 GHz. One of ordinary skill in the art will understand that the RF amplifier 112 can be implemented in other types of ICs using varying standards. In other embodiments, the IC 100 can be implemented in a pure analog environment, or implemented on a chip used just for amplification.

The input/output unit 105 interfaces the IC 100 with a channel that transmits signals between devices. The RF analog unit 110 is a generic grouping of analog components such as the RF amplifier 112. The PHY unit 120 includes digital components to implement PHY-layer functionality of the OSI model, such as transforming frames to signals. The MAC unit 130 implements MAC-layer functionality of the OSI model, such controlling access to the PHY layer and managing communications between devices.

The RF amplifier 112 can be a multistage or cascaded RF amplifier. The RF amplifier 112 amplifies input signals while minimizing undesirable oscillation between amplifier stages. In one embodiment, the oscillation is reduced by replicating a voltage swing due to oscillation at one node of the RF amplifier 112 to another node of the RF amplifier 112, such that a net voltage swing approaches zero. One example of a circuit-implementation of the RF amplifier 112 is described in further detail below.

Figure 2:
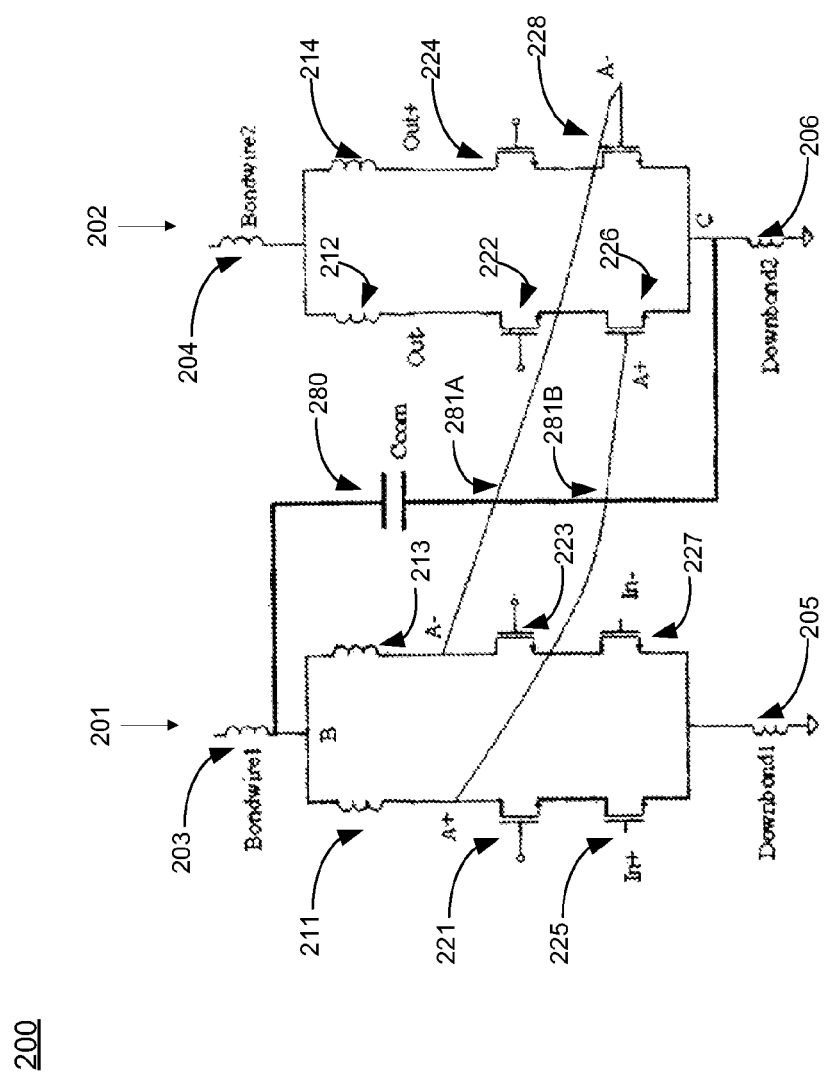
FIG. 2 is a schematic diagram illustrating an implementation of the RF amplifier, according to one embodiment of the present invention.

FIG. 2 is a schematic diagram illustrating an RF amplifier 200, according to one embodiment of the present invention. The circuit of RF amplifier 200 can be an exemplary implementation of the RF amplifier 112. The RF amplifier 200 comprises a first amplifier circuit 201 and a second amplifier circuit 202. The first amplifier 201 is configured as a first stage of amplification, having outputs coupled to inputs of the second amplifier 202 as a second stage of amplification, via wires 281A, 281B. Although the RF amplifier 200 shows two amplification stages, each stage using two parallel transistors, one of ordinary skill in the art will understand that any number of amplification stages and transistors can be used.

The first amplifier 201 further comprises inductors 203, 205, inductors 211, 213, and FETs 221, 223, 225, 227. The first amplifier 201 is configured for differential signaling with two conductive paths between inductors 203, 205. The inductors 203, 205 represent a parasitic capacitance property displayed by a bondwire and a downbond, respectfully. One conductive path comprises serial connections between the inductor 203, the inductor 211, the FET 221, the FET 225, and the inductor 205. Another conductive path comprises serial connections between the inductor 203, the inductor 213, the FET 223, the FET 227, and the inductor 205. In this configuration, two input terminals are provided, one complementary input across gates of FETs 221, 225, and another complementary input at across gates of FETs 223, 227. Also, two output terminals are provided, one at each drain of FETs 221, 223.

Similarly, the second amplifier 202 further comprises inductors 204, 206, inductors 212, 214, and FETs 222, 224, 226, 228. The second amplifier 202 is configured for differential signaling with two conductive paths between inductors 204, 206. The inductors 204, 206 represent a parasitic capacitance property displayed by a bondwire and a downbond, respectfully. One conductive path comprises serial connections between the inductor 204, the inductor 212, the FET 222, the FET 226, and the inductor 206. Another conductive path comprises serial connections between the inductor 204, the inductor 214, the FET 224, the FET 228, and the inductor 206. In this configuration, two input terminals are provided, one complementary input across gates of FETs 222, 226, and another complementary input across gates of FETs 224, 228. Also, two output terminals are provided, one at each drain of FETs 222, 224.

A capacitor 280 is coupled between node B of the first amplifier circuit 201 and node C of the second amplifier circuit 202. Node B servers as the common connection point between the inductors 211, 213 connected to the output terminals of the first amplifier circuit 201. A capacitance value of the capacitor 280 can be implementation-specific, and selected in accordance with inductance values of the inductors 211, 213. Node C serves as a common connection point between the sources of the FETs 226, 228 of the second amplifier circuit 202.

As a result of the configuration, common mode oscillations can be minimized or substantially cancelled. At a high-level, a short between nodes B and C allow the common modes to follow oscillations of the first amplifier circuit 201. More specifically, when the voltage change is output from the first amplifier 201, a voltage difference across the gate and source of FETs 226, 228 follows. At the same time, the same voltage change is also output from the first amplifier 201 at node B. The net voltage change is nearly zero, thereby offsetting the voltage difference across the gate and source of FETs 226, 228. For example, the gate voltage can increase, but the source voltage increases by substantially the same amount such that the voltage difference remains substantially the same. There may be some negligible voltage difference remaining that does not affect amplification operations.

Figure 3:
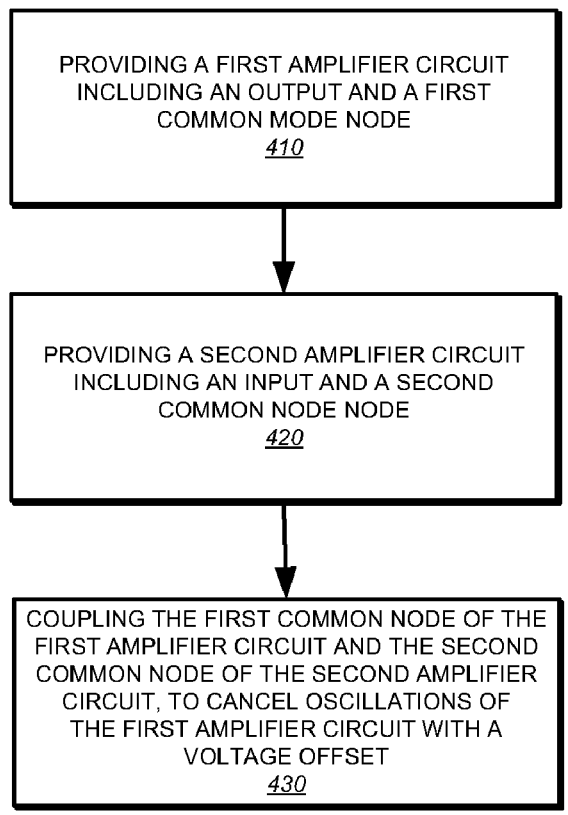
FIG. 3 is a flow chart illustrating a method of canceling oscillation in the RF amplifier, according to one embodiment of the present invention.

FIG. 3 is a flow chart illustrating a method 300 of canceling oscillation in a multiphase amplifier, according to one embodiment of the present invention. The method 300 can be implemented using the IC 100 of FIG. 1 and the amplifier 200 of FIG. 2. A first amplifier circuit is provided 410. The first amplifier circuit can include an output and a first common mode node. A second amplifier circuit is provided 420. The second amplifier circuit can include an input and a second common mode node. A voltage offset to cancel oscillations of the first amplifier circuit is provided 430. In one embodiment, the first common mode node and the second common mode nodes are coupled together.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A multi-stage amplifier circuit to minimize common mode oscillation, comprising:
    a first amplifier circuit including an output and a first common mode node;
    a second amplifier circuit coupled to the output of the first amplifier circuit and including an input and a second common mode node; and
    a wire coupled between the first common mode node of the first amplifier circuit and the second common mode node of the second amplifier circuit, the wire feeding a voltage swing of the first common mode node to the second common mode node to cancel out a voltage swing fed from the output of the first amplifier circuit to the input of the second amplifier circuit.

2. The circuit of claim 1 wherein the output of the first amplifier circuit includes a differential output.

3. The circuit of claim 1, wherein the input of the second amplifier circuit includes a differential input across a first gate of a first transistor and a second gate of a second transistor.

4. The circuit of claim 3 wherein the second common mode node couples a first source of the first transistor and a second source of the second transistor.

5. The circuit of claim 4 wherein the wire cancels the voltage swing by maintaining a voltage potential between the gate and the source of the first transistor and the gate and the source of the second transistor that is substantially unaffected by oscillations of the first amplifier circuit.

6. The circuit of claim 1, wherein the first amplifier circuit has a cascaded connection with the second amplifier circuit.

7. The circuit of claim 1, wherein the first amplifier circuit includes a first bondwire and a first downbond wire, and the second amplifier circuit includes a second bondwire and a second downbond wire.

8. The circuit of claim 1, wherein the wire includes a capacitor to adjust a voltage difference and a phase difference between the first common mode node and the output of the first amplifier circuit.

9. An integrated circuit, comprising:
a digital circuit; and
a multi-stage analog amplifier circuit comprising:
   a first amplifier circuit including an output and a first common mode node:
   a second amplifier circuit, coupled to the output of the first amplifier circuit and including an input and a second common mode node; and
   a wire coupled between the first common mode node of the first amplifier circuit and the second common mode node of the second amplifier circuit, the wire feeding a voltage swing of the first common mode node to the second common mode node to cancel out a voltage swing fed from the output of the first amplifier circuit to the input of the second amplifier circuit.

10. The integrated circuit of claim 9, wherein the integrated circuit is configured for transmitting communication signals in a wireless local access network (WLAN).

11. A method of minimizing common mode oscillation in a multi-stage amplifier circuit, the method comprising:
   providing a first amplifier circuit including an output and a first common mode node;
   providing a second amplifier circuit, coupled to the output of the first amplifier circuit and including an input and a second common mode node; and
   coupling the first common mode node of the first amplifier circuit and the second common mode node of the second amplifier circuit, to feed a voltage swing of the first common mode node to the second common mode node to cancel out a voltage swing fed from the output of the first amplifier circuit to the input of the second amplifier circuit.

12. The method of claim 11, wherein the output of the first amplifier circuit includes a differential output.

13. The method of claim 11, wherein the input of the second amplifier circuit includes a differential input across a first gate of a first transistor and a second gate of a second transistor.

14. The method of claim 13, wherein the second common mode node couples a first source of the first transistor and a second source of the second transistor.

15. The method of claim 14, wherein the wire cancels the voltage swing by maintaining a voltage potential between the gate and the source of the first transistor and the gate and the source of the second transistor that is substantially unaffected by oscillations of the first amplifier circuit.

16. The method of claim 11, wherein the first amplifier circuit has a cascaded connection with the second amplifier circuit.

17. The method of claim 11, wherein the first amplifier circuit includes a first bondwire and a first downbond wire, and the second amplifier circuit includes a second bondwire and a second downbond wire.

18. The method of claim 11, wherein the wire includes a capacitor to adjust a voltage difference and a phase difference between the first common mode node and the output of the first amplifier circuit.

* * * * *